(12) United States Patent
Kim

(10) Patent No.: US 9,472,466 B2
(45) Date of Patent: Oct. 18, 2016

(54) SEMICONDUCTOR DEVICE HAVING REDUCED-DAMAGE ACTIVE REGION AND METHOD OF MANUFACTURING THE SAME

(71) Applicant: Samsung Electronics Co., Ltd., Suwon-Si, Gyeonggi-Do (KR)

(72) Inventor: Ki-chul Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 48 days.

(21) Appl. No.: 14/607,804

(22) Filed: Jan. 28, 2015

(65) Prior Publication Data

US 2015/0140749 A1    May 21, 2015

Related U.S. Application Data

(63) Continuation of application No. 11/907,106, filed on Oct. 9, 2007, now abandoned.

(30) Foreign Application Priority Data

Oct. 11, 2006 (KR) .................. 10-2006-0099058

(51) Int. Cl.
*H01L 21/336* (2006.01)
*H01L 21/8238* (2006.01)
*H01L 29/78* (2006.01)

(52) U.S. Cl.
CPC ........... *H01L 21/823878* (2013.01); *H01L 21/823807* (2013.01); *H01L 21/823814* (2013.01); *H01L 21/823864* (2013.01); *H01L 29/7843* (2013.01)

(58) Field of Classification Search
CPC ............. H01L 21/823807; H01L 21/823814; H01L 21/823864; H01L 29/7843
See application file for complete search history.

(56) References Cited

U.S. PATENT DOCUMENTS

| 5,956,591 A | 9/1999 | Fulford, Jr. |
| 6,087,239 A | 7/2000 | Juengling |
| 7,115,954 B2 | 10/2006 | Shimizu et al. |
| 2004/0029323 A1* | 2/2004 | Shimizu et al. ............. 438/142 |
| 2005/0233552 A1 | 10/2005 | Ke et al. |
| 2006/0267106 A1 | 11/2006 | Chao et al. |
| 2007/0023843 A1 | 2/2007 | Shimizu et al. |
| 2007/0034906 A1 | 2/2007 | Wang et al. |
| 2007/0040225 A1 | 2/2007 | Yang |
| 2007/0122966 A1 | 5/2007 | Hoentschel et al. |
| 2007/0243686 A1* | 10/2007 | Chen et al. .................. 438/301 |

FOREIGN PATENT DOCUMENTS

| JP | 2004-273818 A | 9/2004 |
| KR | 2003-0082538 A | 10/2003 |
| KR | 10-2006-0064545 | 6/2006 |
| WO | WO-02/43151 A1 | 5/2002 |

* cited by examiner

*Primary Examiner* — Meiya Li
(74) *Attorney, Agent, or Firm* — Harness, Dickey & Pierce, P.L.C.

(57) ABSTRACT

A semiconductor device according to example embodiments may include a substrate having an NMOS area and a PMOS area, isolation regions and well regions formed in the substrate, gate patterns formed on the substrate between the isolation regions, source/drain regions formed in the substrate between the gate patterns and the isolation regions, source/drain silicide regions formed in the source/drain regions, a tensile stress layer formed on the NMOS area, and a compressive stress layer formed on the PMOS area, wherein the tensile stress layer and compressive stress layer may overlap at a boundary region of the NMOS area and the PMOS area. The semiconductor devices according to example embodiments and methods of manufacturing the same may increase the stress effect on the active region while reducing or preventing surface damage to the active region.

10 Claims, 25 Drawing Sheets

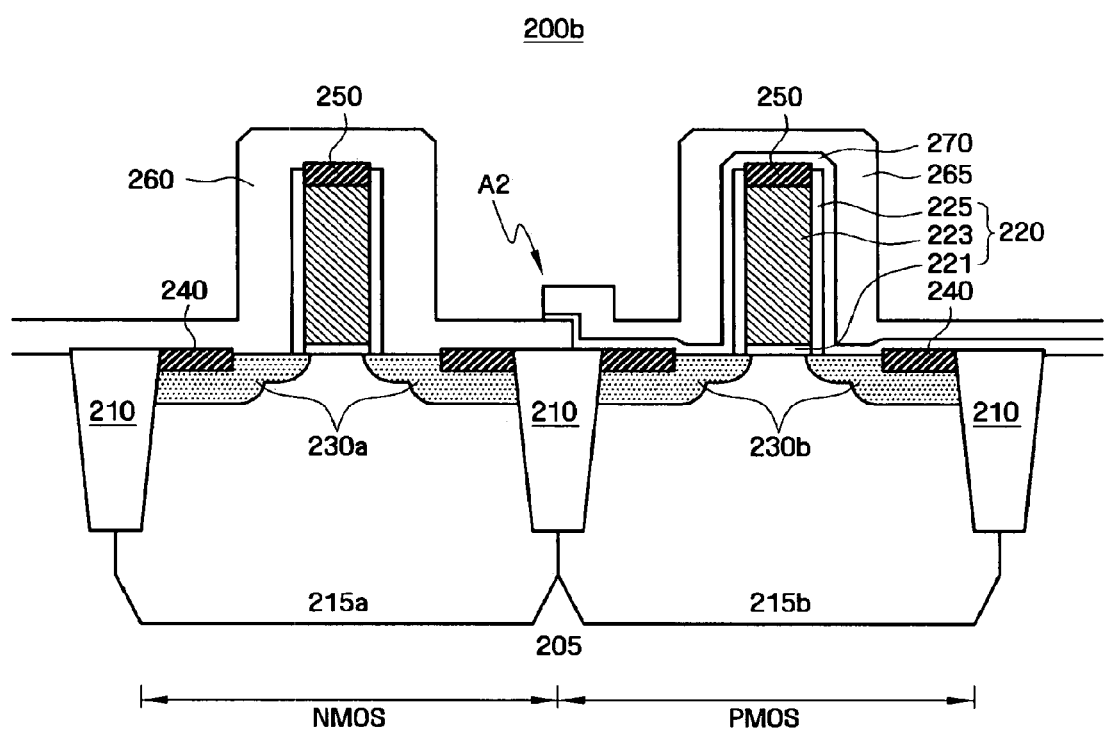

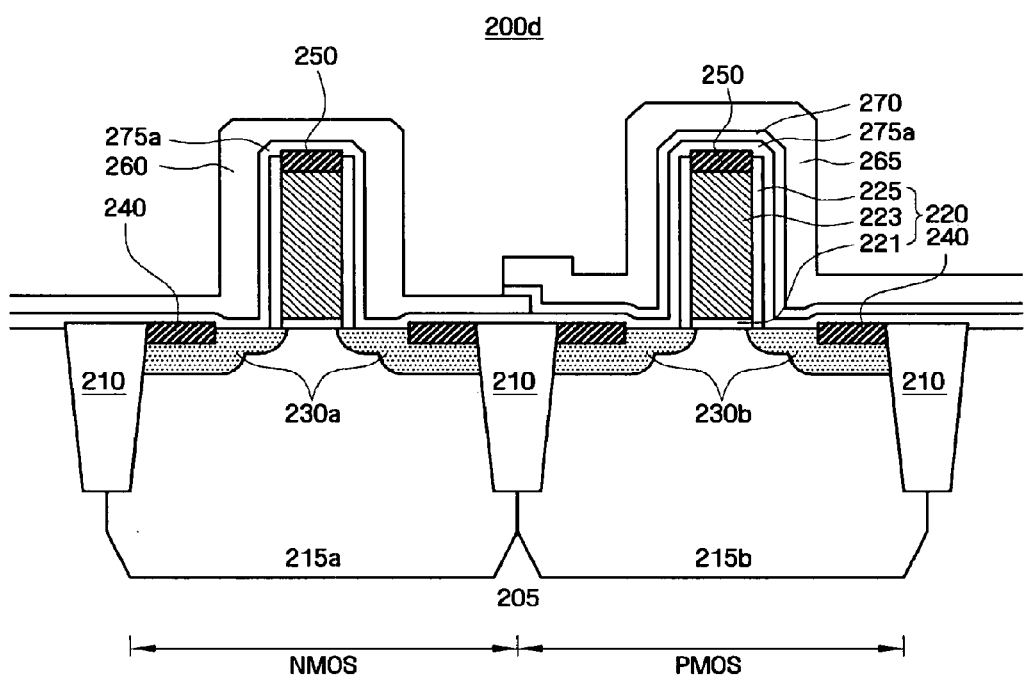

SEMICONDUCTOR DEVICE HAVING REDUCED-DAMAGE ACTIVE REGION AND METHOD OF MANUFACTURING THE SAME

PRIORITY STATEMENT

This application is a Continuation claiming priority under 35 U.S.C. §120 to U.S. application Ser. No. 11/907,106, filed Oct. 9, 2007, which claims priority under 35 U.S.C. §119 to Korean Patent Application No. 10-2006-0099058, filed on Oct. 11, 2006 in the Korean Intellectual Property Office (KIPO), the entire contents of each of which are incorporated herein by reference.

BACKGROUND

1. Technical Field

Example embodiments relate to a semiconductor device having stress layers and a method of manufacturing the same, wherein surface damage to the active regions may be reduced or prevented during the stress layer formation process.

2. Description of the Related Art

Increasing the mobility of carriers in a material layer is being researched in an effort to develop higher integrated semiconductor devices. To increase the mobility of carriers, a tensile stress or a compressive stress may be applied to an active region by way of a stress layer. A tensile stress layer may be formed on an NMOS area where electrons may act as major carriers. A compressive stress layer may be formed on a PMOS area where holes may act as major carriers. To increase the effect of stress, a source/drain region of a PMOS area may be formed of SiGe, and a stress layer may be formed closer to a top surface of the active region.

However, a NMOS area and a PMOS area may have a gate spacer, thus resulting in a stress layer being formed on the gate spacer. Consequently, the stress layer may be distanced from the active region by a distance corresponding to the thickness of the gate spacer, which may render it more difficult to apply sufficient stress on the active region. Accordingly, it may be beneficial to form the stress layer after removing the gate spacer. However, etching damage may occur to the top surface of the active region, including the source/drain region, when removing the gate spacer. For example, a source/drain region made of SiGe in the PMOS area may be relatively vulnerable to the etching process and, thus, may be recessed more deeply than a source/drain region made of silicon.

A conventional method for forming stress layers of a semiconductor device will be described below with reference to the accompanying drawings. FIGS. 1A and 1B are longitudinal sectional views illustrating a conventional method of forming stress layers of a semiconductor device 100. Referring to FIG. 1A, the semiconductor device 100 may be manufactured by forming isolation regions 110 and well regions 115a and 115b in a substrate 105; forming gate patterns 120 including a gate insulating layer 121, a gate electrode 123, and a first gate spacer 125; forming source/drain regions 130a and 130b; forming second gate spacers 150; and forming silicide regions 140 and 145. Stress layers may be formed after forming the silicide regions 140 and 145. However, the second gate spacers 150 may distance the stress layers from the source/drain regions 130a and 130b of the substrate 105, thus reducing the desired stress effect. Accordingly, to ensure a sufficient stress effect, it may be beneficial to form the stress layers after removing the second gate spacers 150. However, damage to the active region may occur when removing the second gate spacers 150.

FIG. 1B is a longitudinal sectional view illustrating the damage caused during the removal of the second gate spacers 150. Referring to FIG. 1B, the top surfaces of the silicide regions 140a and 145a and the top surfaces of the source/drain regions may be recessed (R) and certain parts of the active regions may be deeply recessed or dented (D). Technical publications may be silent about this damage to the surfaces of the active regions.

For example, the second gate spacers 150 may be formed of silicon nitride. Because silicon nitride may be more rigid than other film materials used in a semiconductor fabrication, damage may occur to the other film materials during the removal of the second gate spacers 150. When the silicide regions 140a and 145a and the source/drain regions 130a and 130b are surface-recessed, conductive regions may be narrowed, thus increasing resistance and junction leakage. Additionally, if a process for removing the second gate spacers 150 is unsteady, the silicide regions 140a and 145a may be completely removed. Furthermore, when dents D are generated in the active regions, stronger electric fields or higher resistances may be generated locally, thus causing a punch-through phenomenon.

SUMMARY OF EXAMPLE EMBODIMENTS

Example embodiments provide a semiconductor device having a stress layer and a method of manufacturing the same, wherein a stress layer may be formed closer to an active region of a substrate while reducing or preventing etching damage to the active region. A semiconductor device according to example embodiments may include a substrate having an NMOS area and a PMOS area, isolation regions and well regions formed in the substrate, gate patterns formed on the substrate so as to be disposed between the isolation regions, source/drain regions formed in the substrate so as to be disposed between the gate patterns and the isolation regions, source/drain silicide regions formed in the source/drain regions, a tensile stress layer formed on the NMOS area, and/or a compressive stress layer formed on the PMOS area.

A method of manufacturing a semiconductor device according to example embodiments may include forming isolation regions and well regions in a substrate having an NMOS area and a PMOS area, forming gate patterns on the substrate so that the gate patterns are disposed between the isolation regions, forming first source/drain regions having first ion-concentrations between the gate patterns and the isolation regions, forming first spacers on sidewalls of the gate patterns, forming second spacers on sidewalls of the first spacers, forming source/drain silicide regions in the source/drain regions, removing the second spacers, removing the first spacers, forming a tensile stress layer on the NMOS area, and/or forming a compressive stress layer on the PMOS area.

BRIEF DESCRIPTION OF THE DRAWINGS

FIGS. 2A through 2D illustrate schematic longitudinal sectional views illustrating semiconductor devices according to example embodiments.

DETAILED DESCRIPTION OF EXAMPLE EMBODIMENTS

Figure 1A:
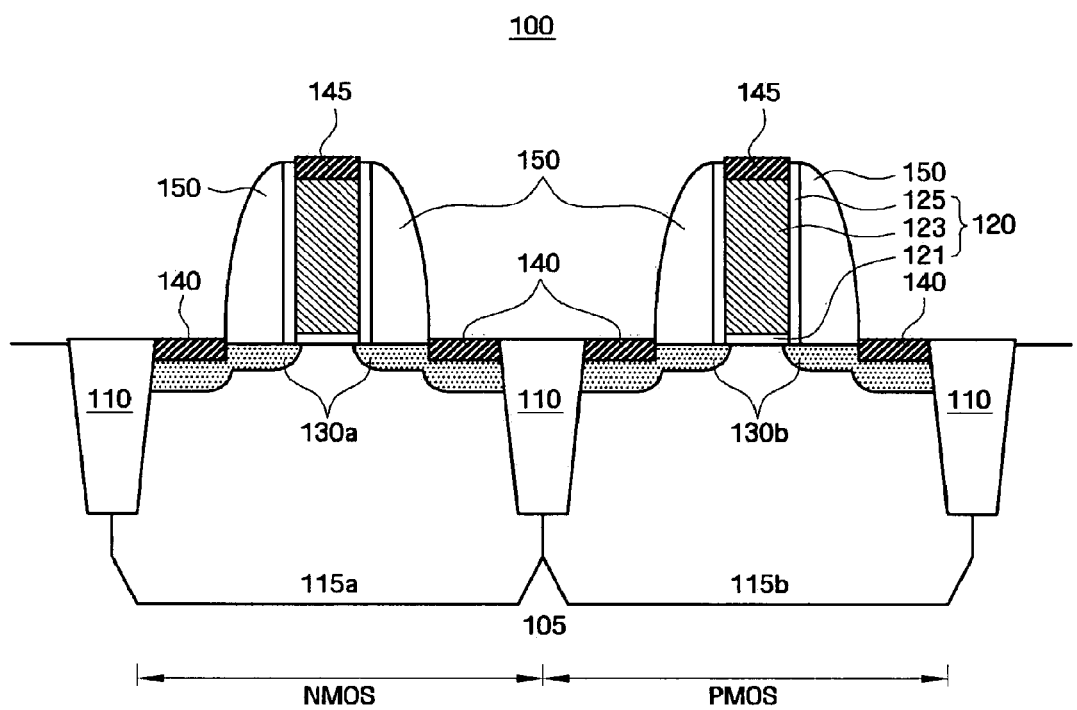
FIGS. 1A and 1B illustrate longitudinal sectional views illustrating a conventional method of forming stress layers of a semiconductor device.
Figure 1B:
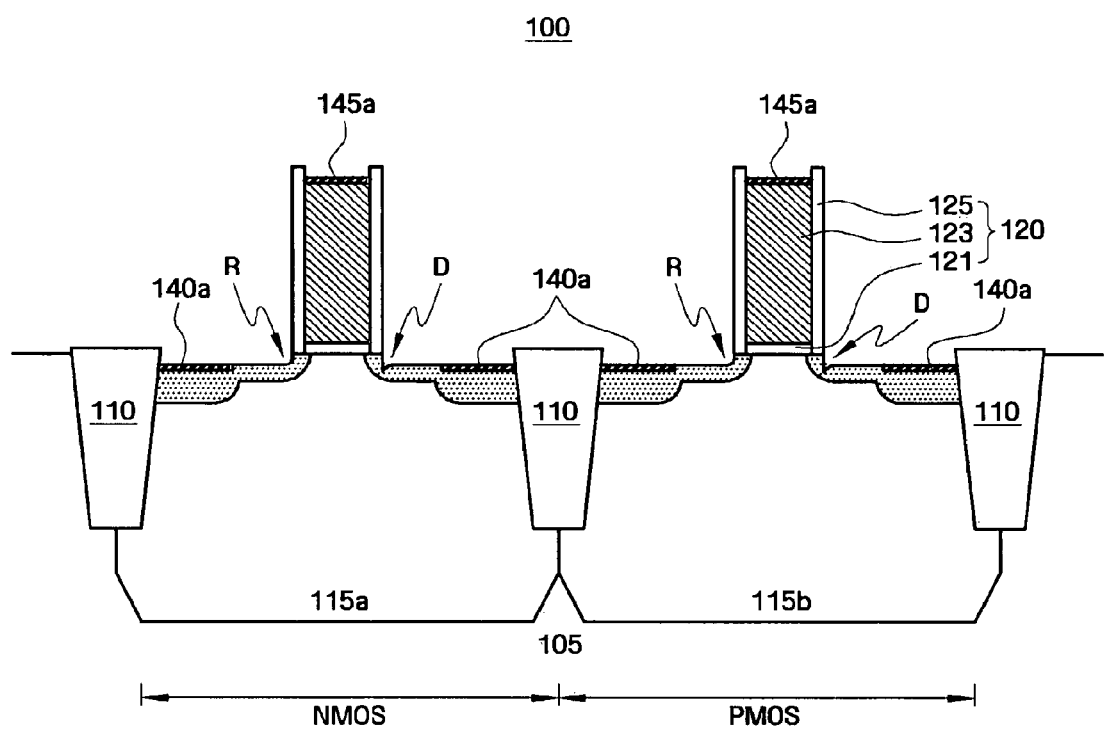

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Example embodiments relating to a semiconductor device having stress layers and a method of manufacturing the same may be described below with reference to the accompanying drawings. In the drawings, the thickness of the layers and regions may have been exaggerated for clarity. Example embodiments have been provided for illustrative purposes only. Accordingly, the present disclosure should not be interpreted as being limited to the examples described herein.

Figure 2A:
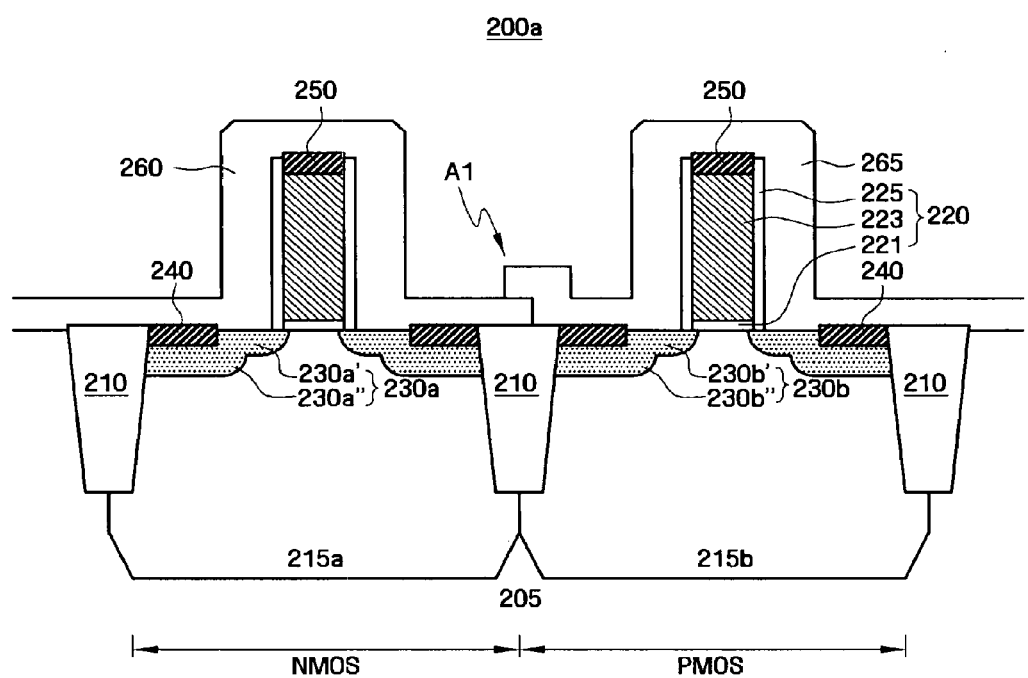

FIGS. 2A through 2D illustrate schematic longitudinal sectional views of semiconductor devices according to example embodiments. Referring to FIG. 2A, a semiconductor device 200a may include isolation regions 210 and well regions 215a and 215b formed in a substrate 205; gate patterns 220 including a gate insulating layer 221, a gate electrode 223, and a gate spacer 225; source/drain regions 230a and 230b disposed between the gate patterns 220 and the isolation regions 210; source/drain silicide regions 240 and gate silicide regions 250 disposed in the source/drain regions 230a and 230b and on the gate electrodes 223, respectively; a tensile stress layer 260 disposed on an NMOS area, and a compressive stress layer 265 disposed on a PMOS area.

The source/drain regions 230a and 230b may not have been surface-recessed, and the surfaces of the source/drain regions 230a and 230b may be at the same level as the interfacial surface between the gate pattern 220 and the substrate 205. The surfaces of the source/drain silicide regions 240 may be higher than the surfaces of the source/drain regions 230a and 230b. The surfaces of the gate silicide regions 250 may be higher than the surfaces of the gate spacers 225.

The low-concentration source/drain regions 230a' and 230b' may be closer (e.g., horizontally) to the corresponding gate patterns 220 than the high-concentration source/drain regions 230a" and 230b". The source/drain silicide regions 240 may be farther (e.g., horizontally) from the corresponding gate patterns 220 than the high-concentration source/drain regions 230a" and 230b". Alternatively, the horizontal distance between the gate patterns 220 and the corresponding high-concentration source/drain regions 230a" and 230b" may be about the same as the horizontal distance between the gate patterns 220 and the corresponding source/drain silicide regions 240. The above distances may be achieved by selecting the appropriate processes for forming the high-concentration source/drain regions 230a" and 230b" and the source/drain silicide regions 240.

The source/drain regions 230b of the PMOS area may be formed of SiGe so as to allow more compressive stress to be exerted on the active regions of the PMOS area. Substrate regions intended to serve as the active regions may be recessed, and SiGe may be grown within the recessed regions so that the SiGe layers may serve as the active regions of the PMOS area. Ion-implantation may be performed on the SiGe layers so as to form the source/drain regions 230b.

The compressive stress layer 265 may be formed to overlap with the tensile stress layer 260 at a boundary region A1 between the NMOS area and the PMOS area. The tensile stress layer 260 and the compressive stress layer 265 may be formed on the gate silicide regions 250, the gate spacers 225, the source/drain regions 230a and 230b, and the source/drain silicide regions 240, thus providing an increased stress effect. Furthermore, the gate silicide regions 250, the source/drain regions 230a and 230b, and the source/drain silicide regions 240 may not have been recessed during the formation of the tensile and compressive stress layers 260 and 265 and, thus, may be at or near their original heights.

Referring to FIG. 2B, a semiconductor device 200b according to example embodiments may be the same as the semiconductor device 200a (FIG. 2A) except that a compressive buffer layer 270 may be formed below a compressive stress layer 265. The compressive buffer layer 270 may be used as an etch-stop layer to pattern the compressive stress layer 265. Because the compressive stress layer 265 may be formed of silicon nitride, the compressive buffer layer 270 may improve the interfacial contact between the compressive stress layer 265 and a substrate 205 made of silicon. Silicon nitride may have a decreased interfacial contact with silicon due to the difference in coefficient of thermal expansion, which may cause lifting or distortion of the silicon nitride from the silicon. Accordingly, this phenomenon may be alleviated or prevented with the compressive buffer layer 270. The compressive buffer layer 270 may be formed between the compressive stress layer 265 and the substrate 205, the source/drain regions 230b, the source/drain silicide regions 240, the gate spacers 225, and/or the gate silicide regions 250 in a PMOS area. The compressive buffer layer 270 may overlap with the tensile stress layer 260 in a boundary region A2 between the NMOS and PMOS areas.

Figure 2C:
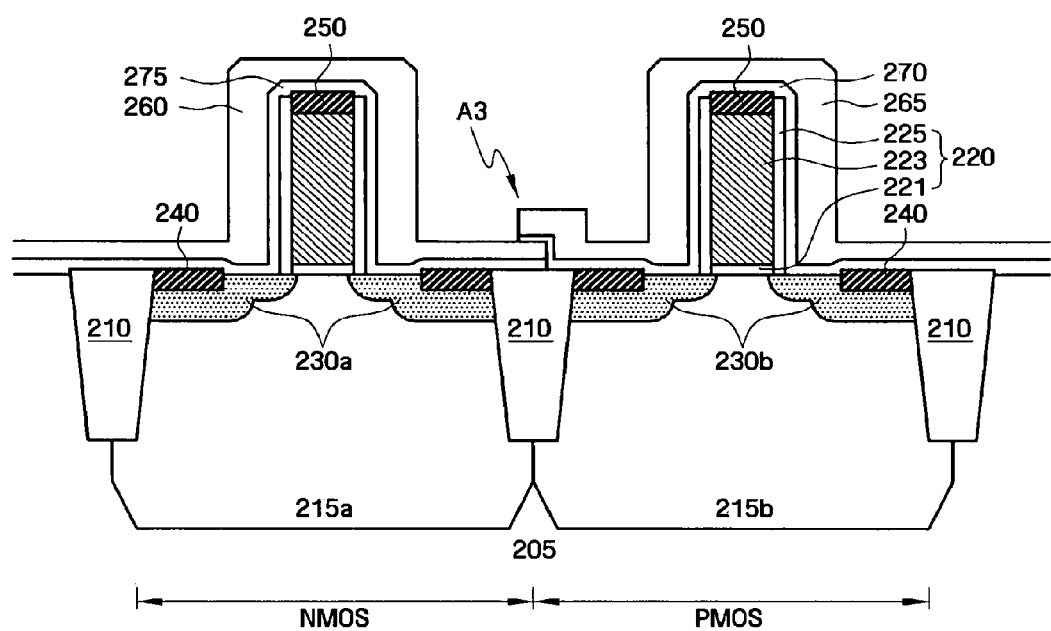

Referring to FIG. 2C, a semiconductor device 200c according to example embodiments may be the same as the semiconductor device 200b (FIG. 2B) except that a tensile buffer layer 275 may be formed below a tensile stress layer 260. The tensile buffer layer 275 may be used as an etch-stop layer to pattern the tensile stress layer 260. Because the tensile stress layer 260 may be formed of silicon nitride, the tensile buffer layer 275 may improve the interfacial contact between the tensile stress layer 260 and a substrate 205 made of silicon. The tensile buffer layer 275 may be formed between the tensile stress layer 260 and the substrate 205, the source/drain regions 230a, the source/drain silicide regions 240, the gate spacers 225, and/or the gate silicide regions 250 in a NMOS area. The tensile buffer layer 275 may be overlapped by the compressive stress layer 265 and/or the compressive buffer layer 270 in a boundary region A3 between the NMOS and PMOS areas.

Referring to FIG. 2D, a semiconductor device 200d according to example embodiments may be the same as the semiconductor device 200c (FIG. 2C) except that both a tensile buffer layer 275a and a compressive buffer layer 270 may be formed in a PMOS area. A single buffer layer (e.g., a tensile buffer layer 275a) may be formed in the NMOS area, and two buffer layers (e.g., a tensile buffer layer 275a and a compressive buffer layer 270) may be formed in the PMOS area. Consequently, the buffer layer structure of the PMOS area may be thicker than the buffer layer of the NMOS area. If the tensile buffer layer 275a and the compressive buffer layer 270 are made of the same material, then a boundary between the tensile buffer layer 275a and the compressive buffer layer 270 may not be present or may not be clearly defined.

As illustrated in semiconductor devices 200a-200d (FIGS. 2A-2D) according to example embodiments, at least a portion of the surface of source/drain regions 230a and 230b may be at about the same level as an interfacial surface between a gate insulating layer 221 and a substrate 205 because of the reduction or prevention of damage to the active regions during manufacturing. Thus, the source/drain silicide region 240 may be at the same level as or higher than an interfacial surface between the gate insulating layer 221 and the substrate 205. Additionally, a horizontal distance from a gate pattern 220 to a corresponding high-concentration source/drain region 230a" and 230b" may be the same as or smaller than a horizontal distance from the gate pattern 220 to a corresponding source/drain silicide region 240.

Referring to FIGS. 2A through 2D, an inter-insulating layer (not shown) may be formed on the tensile stress layer 260 and the compressive stress layer 265. Contact or via plugs (not shown) may be formed so as to be electrically connected to the source/drain silicide regions 240 and the gate silicide regions 250. For example, contact or via holes may be formed in the stress layers 260 and 265 so as to selectively expose the source/drain silicide regions 240 and the gate silicide regions 250. The contact or via holes may be filled with a conductive material to thereby form contact or via plugs.

FIGS. 3A through 3H are schematic longitudinal sectional views illustrating a method of manufacturing a semiconductor device according to example embodiments.

Figure 3A:
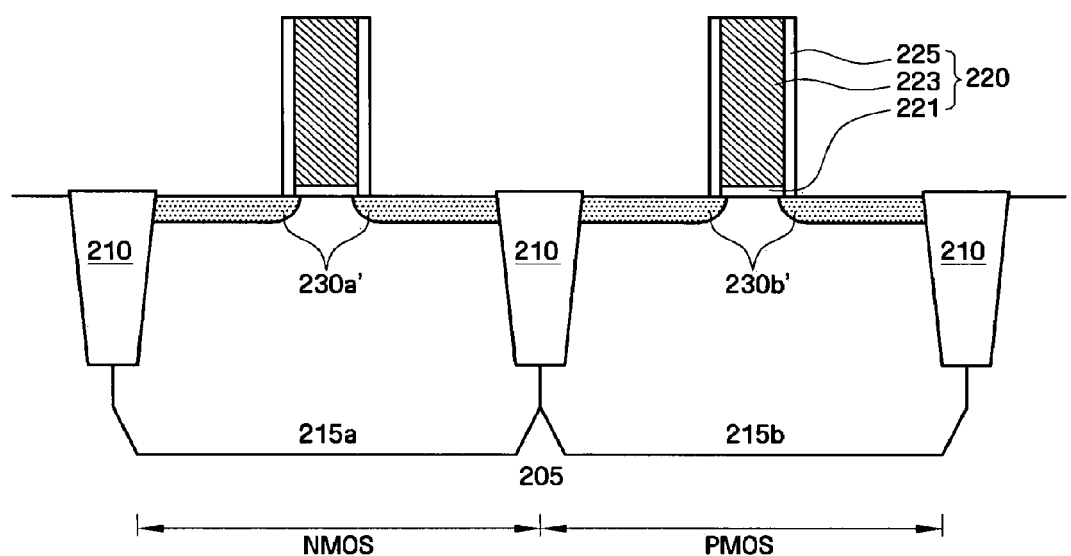
FIGS. 3A through 3H illustrate schematic longitudinal sectional views of a method of manufacturing a semiconductor device according to example embodiments.

Referring to FIG. 3A, isolation regions 210 and well regions 215a and 215b may be formed in a substrate 205. Gate patterns 220 may be formed to include a gate insulating layer 221, a gate electrode 223, and a gate spacer 225. Low-concentration (N− and P−) source/drain regions 230a' and 230b' may be formed in the substrate 205. A NMOS area and a PMOS area may be adjoined. Alternatively, the NMOS area and the PMOS area may be separated from each other.

The substrate 205 may be a silicon substrate or a silicon on insulator (SOI) substrate. The isolation regions 210 may be shallow trench isolation (STI) regions. The well regions 215a and 215b may be a P-type well region 215a in the NMOS area and an N-type well region 215b in the PMOS area. The gate insulating layer 221 may be formed of silicon oxide, but example embodiments are not limited thereto. For example, the gate insulating layer 221 may be made of hafnium oxide, aluminum oxide, or another suitable insulating material. The gate electrode 223 may be formed of polycrystalline silicon, but example embodiments are not limited thereto. For example, the gate electrode 223 may be made of metal silicide, metal, or another suitable conductive material. The gate spacer 225 may be formed of silicon oxide, but example embodiments are not limited thereto. For example, the gate spacer 225 may be made of silicon nitride, silicon oxynitride, or another suitable insulating material. The gate patterns 220 may alternatively include a multi-layered gate insulating layer, a multi-layered gate electrode, and/or a multi-layered gate spacer.

In FIG. 3A, the low-concentration source/drain regions 230a' of the NMOS area may be N-type ion-implanted regions, and the low-concentration source/drain regions 230b' of the PMOS area may be P-type ion-implanted regions. The low-concentration source/drain regions 230a' and 230b' may be overlapped by corresponding gate spacers 225. The low-concentration source/drain regions 230a' and 230b' may also be overlapped by corresponding gate insulating layers 221. The overlapping may be achieved by ion implantation and ion diffusion via thermal treatment.

Figure 3B:
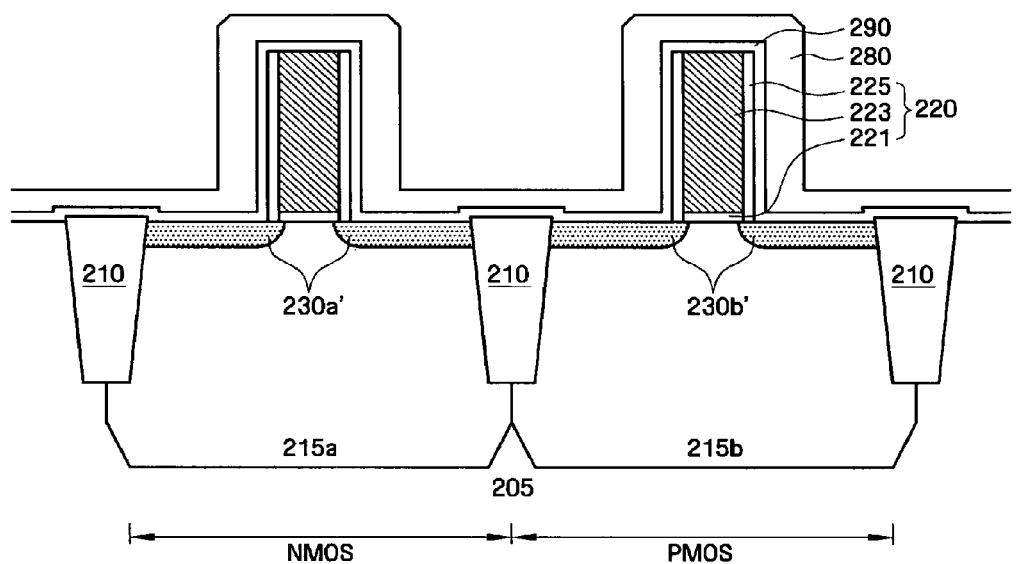

Referring to FIG. 3B, a first etch-stop layer 290 and a buffer spacer layer 280 may be formed on the NMOS area and the PMOS area. The first etch-stop layer 290 may be formed of silicon oxide, and the buffer spacer layer 280 may be formed of SiGe. For example, the first etch-stop layer 290 may be formed of low temperature (silicon) oxide (LTO), but example embodiments are not limited thereto. LTO may be easier to deposit than other silicon oxides. A LTO film may be formed using a CVD process at about 400 degrees Celsius or less. A SiGe layer may be formed using a CVD process while supplying gaseous Si and Ge. The SiGe layer may also be grown from the surface of the substrate 205 and the surfaces of the low-concentration source/drain regions 230a' and 230b'.

The first etch-stop layer 290 may be formed to a thickness of about 100 to 200 angstroms, and the buffer spacer layer 280 may be formed to a thickness of about 400 to 500 angstroms. However, the thicknesses of the first etch-stop layer 290 and the buffer spacer layer 280 are not limited thereto. The SiGe layer may be a material layer selected to provide a faster etch rate than the other surrounding insulating materials, e.g., silicon, silicon oxide, silicon nitride, and silicon oxynitride. Thus, SiGe may be substituted with another material having a faster etch rate than the surrounding materials.

Figure 3C:
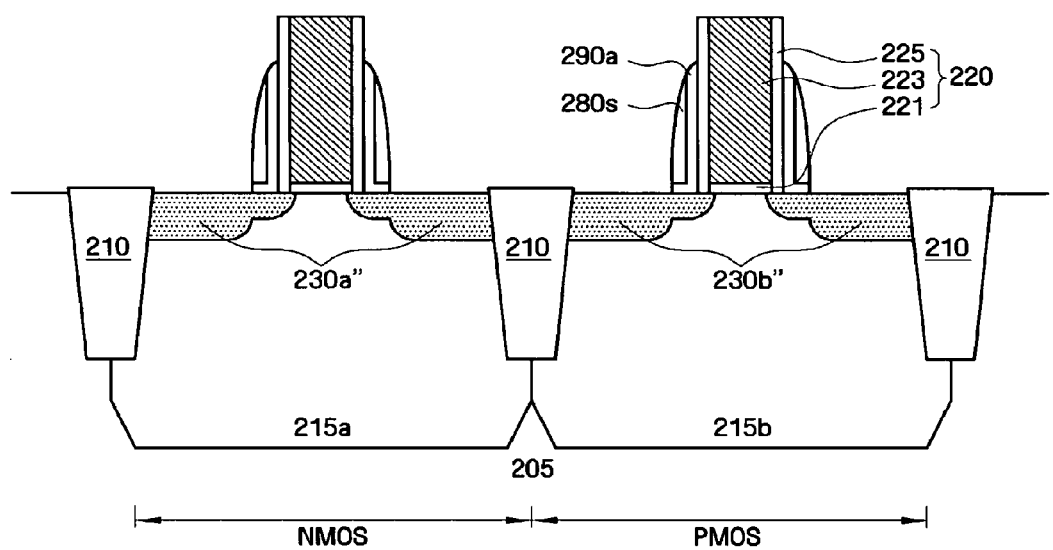

Referring to FIG. 3C, buffer spacers 280s and first etch-stop layer patterns 290a may be formed. The buffer spacers 280s may be formed by etching the buffer spacer layer 280. For example, the buffer spacers 280s may be formed by anisotropically plasma-etching the buffer spacer layer 280 using gases including halogen elements (e.g., F, Cl, or Br). The first etch-stop layer patterns 290a may be formed by leaving the first etch-stop layer 290 only on inner surfaces of the buffer spacers 280s while maintaining the original shape of the first etch-stop layer 290. The buffer spacers 280s may be formed to a height about equal to half the height of the gate patterns 220. The appropriate heights of the buffer spacers 280s may be depend on the characteristics of the semiconductor device and/or the sizes of the gate patterns 220 and the low-concentration source/drain regions 230a' and 230b'. For example, the buffer spacers 280s may be formed to a height equal to about ½ to about ⅔ of the height of the gate patterns 220.

After forming the buffer spacers 280s, high-concentration (N+ and P+) source/drain regions 230a" and 230b" may be formed. A residue of first etch-stop layer 290 on surfaces of the low-concentration source/drain regions 230a' and 230b' may be used as an ion-implantation buffer layer. After forming the high-concentration source/drain regions 230a" and 230b", the residue of first etch-stop layer 290 may be removed so that first etch-stop layer patterns 290a may be present only on inner surfaces of the buffer spacers 280s. Alternatively, the high-concentration source/drain regions 230a" and 230b" may be formed after forming both the buffer spacers 280s and the first etch-stop layer patterns 290a.

Figure 3D:
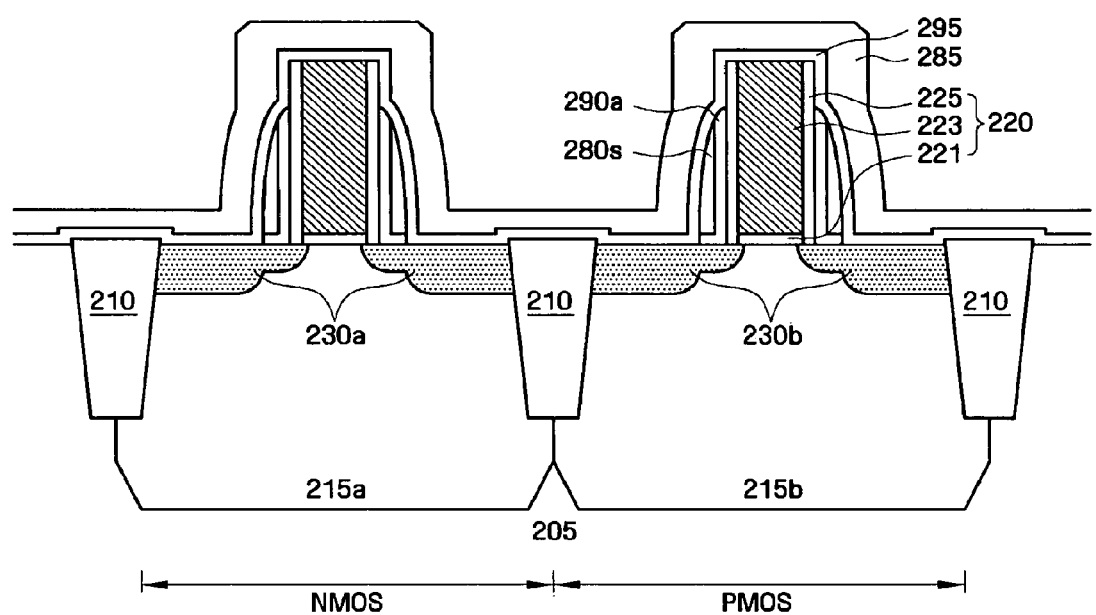

Referring to FIG. 3D, a second etch-stop layer 295 and a mask spacer layer 285 may be formed on the NMOS area and the PMOS area. The second etch-stop layer 295 may be formed in the same manner using the same material as the first etch-stop layer 290. The mask spacer layer 285 may be formed of silicon nitride, but example embodiments are not limited thereto. For example, the mask spacer layer 285 may be formed of another suitable insulating material (e.g., silicon oxide or silicon oxynitride). Formation of the mask spacer layer 285 using silicon nitride may be performed using a CVD process but other suitable methods may also be used. Rather than forming the high-concentration source/drain regions 230a" and 230b" after forming the first etch-stop layer patterns 290a and the buffer spacers 280s, the high-concentration source/drain regions 230a" and 230b" may be alternatively formed after forming the second etch-stop layer 295.

Figure 3E:
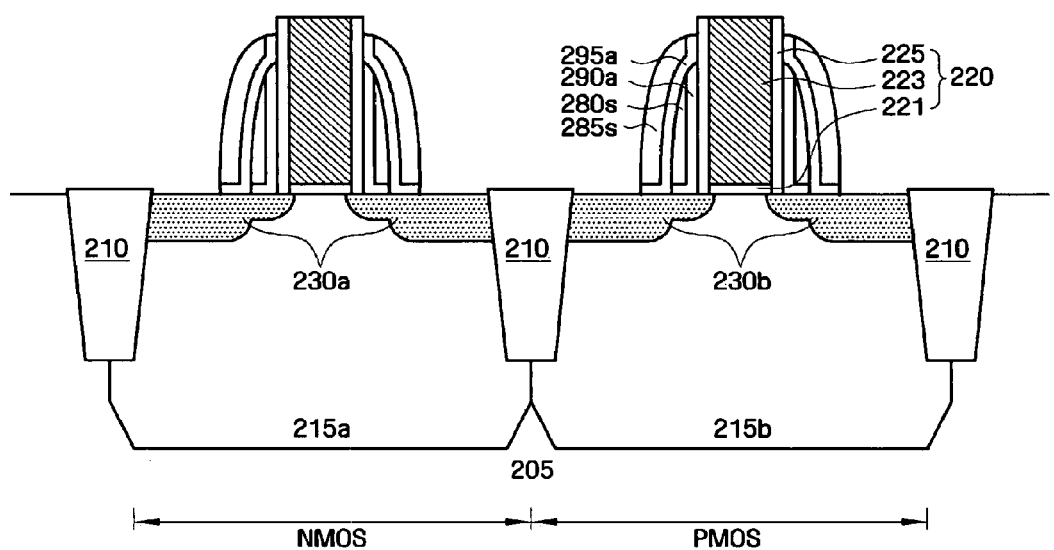

Referring to FIG. 3E, second etch-stop layer patterns 295a and mask spacers 285s may be formed. The mask spacers 285s may be formed by etching the mask spacer layer 285. The mask spacers 285s may surround the buffer spacers 280s. The above-described methods for forming the buffer spacers 280s and the first etch-stop layer patterns 290a may also be applicable for forming the mask spacers 285s and the second etch-stop layer patterns 295a. Rather than forming the high-concentration source/drain regions 230a" and 230b" after forming the buffer spacers 280s, the high-concentration source/drain regions 230a" and 230b" may be alternatively formed after forming the mask spacers 285s. When forming the high-concentration source/drain regions 230a" and 230b" after forming the mask spacers 285s, a residue of the second etch-stop layer 295 on surfaces of the low-concentration source/drain regions 230a' and 230b' may be used as an ion-implantation buffer layer. The residue of the second etch-stop layer 295 on the surfaces of the low-concentration source/drain regions 230a' and 230b' may be removed so as to form the second etch-stop layer patterns 295a, which may be present only on the inner surfaces of the mask spacers 285s. In the semiconductor device 200a according to example embodiments, the horizontal distance from the gate patterns 220 to the corresponding high-concentration source/drain regions 230a" and 230b" may be substantially the same as the horizontal distance from the gate patterns 220 to the corresponding silicide regions 240 (FIG. 3F), described below.

Figure 3F:
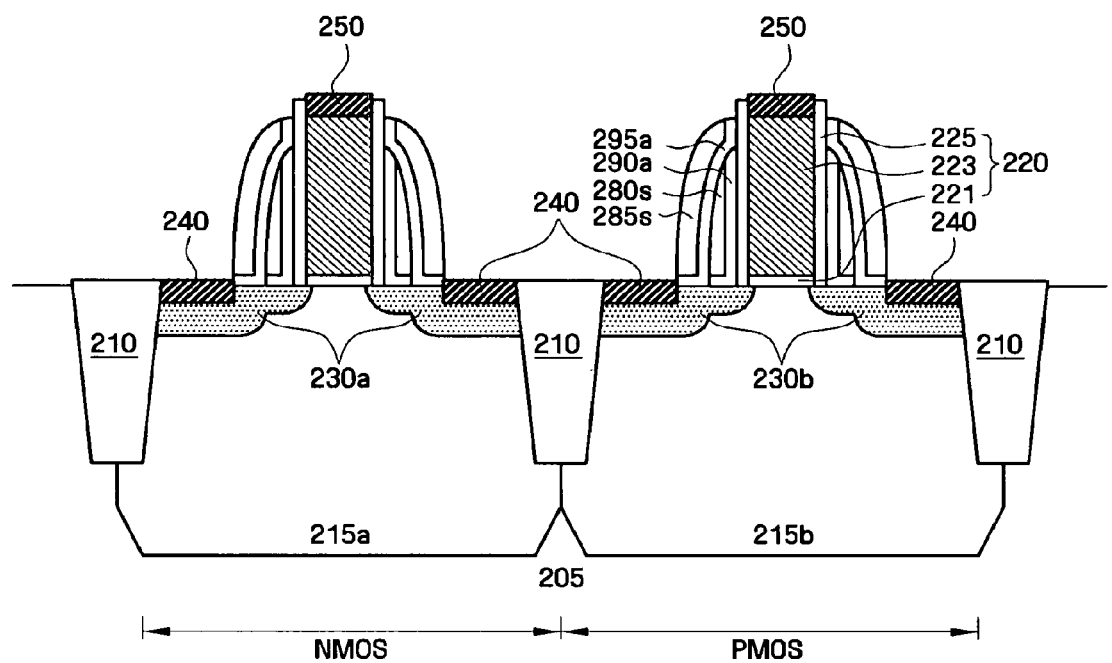

Referring to FIG. 3F, source/drain silicide regions 240 and gate silicide regions 250 may be formed. The source/drain silicide regions 240 and/or the gate silicide regions 250 may be nickel silicide regions, but example embodiments are not limited thereto. For example, the source/drain silicide regions 240 and/or the gate silicide regions 250 may be formed of cobalt silicide, tungsten silicide, titanium silicide, or another suitable metal silicide. Nickel silicide regions may be formed by providing a nickel layer on exposed surfaces of the source/drain regions 230a and 230b and/or the gate electrodes 223 using electroless plating and thermally treating the nickel layer at a higher temperature to cause a nickel silicidation reaction. Another suitable metal layer (e.g., silicidation adjusting metal layer) may be formed on the nickel layer to induce the silicidation reaction. The silicidation adjusting metal may include Ta, Pt, and/or Pd, and may be used to adjust a silicidation reaction rate. The silicidation adjusting metal may also be used as an alloying metal to form a nickel alloy prior to inducing the silicidation reaction. For example, instead of forming a nickel layer and a silicidation adjusting metal layer using electroless plating, a nickel alloy layer may be formed with a plating process using an electrolytic solution containing nickel and an alloying metal. Thus, a silicidation reaction may be induced by forming a silicidation adjusting metal layer on a nickel layer or by using an alloying metal to form a nickel alloy layer.

FIG. 3F illustrates that the surfaces of the silicide regions 240 may be higher than the surface of the substrate 205. Consequently, the surfaces of the source/drain silicide regions 240 may also be higher than the surfaces of the source/drain regions 230a and 230b. Alternatively, the surfaces of the source/drain regions 230a and 230b may be at the same level as the surfaces of the source/drain silicide regions 240. For example, when the silicide regions 240 are nickel silicide regions, nickel may infiltrate into the silicon regions in higher amounts than metals of silicide regions formed of other metal silicides. Accordingly, it may be beneficial to adjust the process conditions such that the surfaces of the source/drain silicide regions 240 may be at the same level as the surfaces of the source/drain regions 230a and 230b. This approach may also be applied to the formation of the gate silicide regions 250.

Figure 3G:
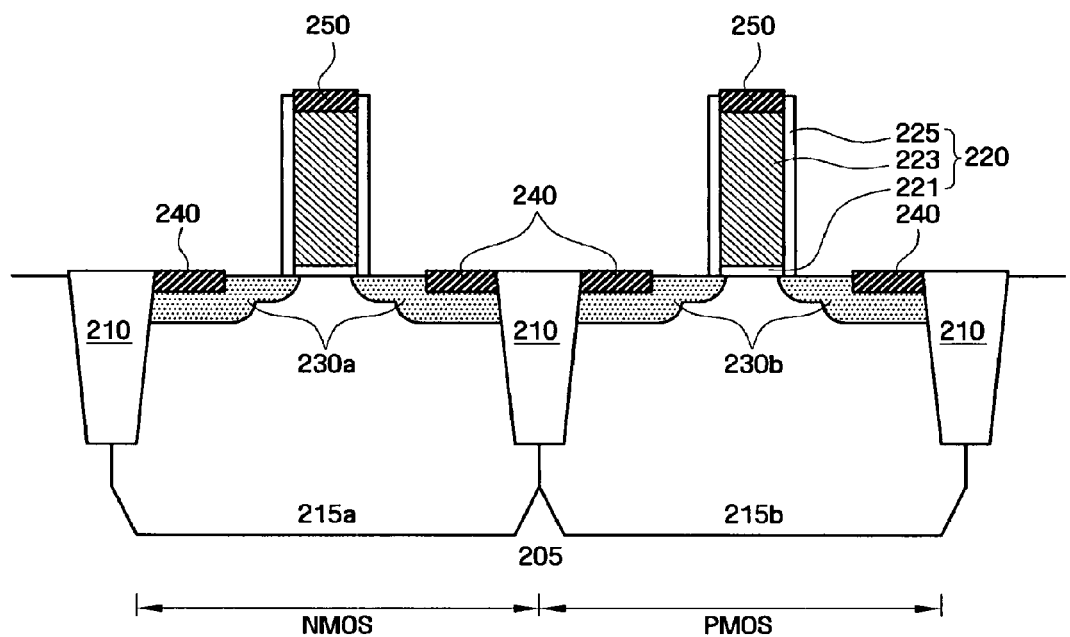

Referring to FIG. 3G, the mask spacers 285s, the second etch-stop layer patterns 295a, the buffer spacers 280s, and the first etch-stop layer patterns 290a may be removed.
The removal of the mask spacers 285s, the second etch-stop layer patterns 295a, the buffer spacers 280s, and the first etch-stop layer patterns 290a may be performed using a wet etching process such that etching damage to the source/drain regions 230a and 230b and the source/drain silicide regions 240 and the gate silicide regions 250 may be reduced or prevented. The mask spacers 285s may be formed of silicon nitride and, thus, may be removed using phosphoric acid. The buffer spacers 280s may be removed using the previously-described dry plasma etching process or a wet process using an SC-1 solution. The removal of the buffer spacers 280s by a wet process using an SC-1 solution may further reduce etching damage to the source/drain regions 230a and 230b and the source/drain silicide regions 240 and the gate silicide regions 250. The first and second etch-stop layer patterns 290a and 295a may be formed of silicon oxide and, thus, may be removed using a diluted HF solution.

Figure 3H:
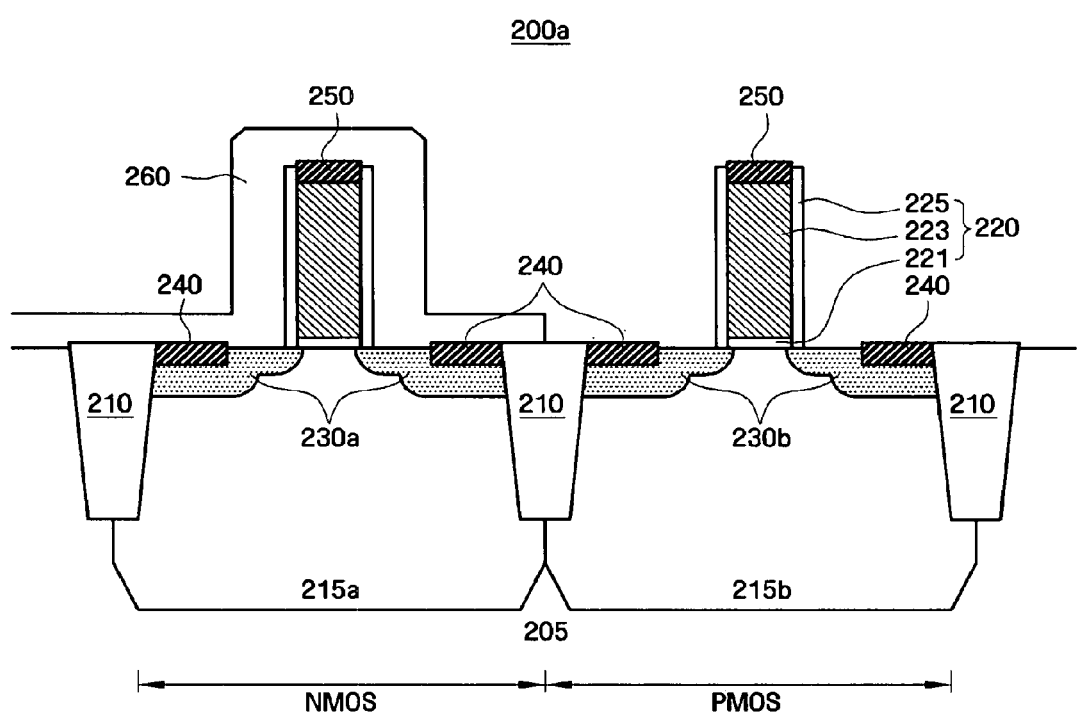

Referring to FIG. 3H, a tensile stress layer 260 may be formed on the NMOS area. For example, a tensile stress layer may be formed on the structure of FIG. 3G and patterned using a photolithography process such that the tensile stress layer 260 is only on the NMOS area. The tensile stress layer 260 may be formed of silicon nitride. Although not shown, a compressive stress layer 265 (FIG. 2A) may be formed on the PMOS area to thereby form the semiconductor device 200a illustrated in FIG. 2A. Similar to the formation of the tensile stress layer 260, a compressive stress layer may be formed on the structure of FIG. 3H and patterned using a photolithography process such that the compressive stress layer 265 is only on the PMOS area.

Figure 4A:
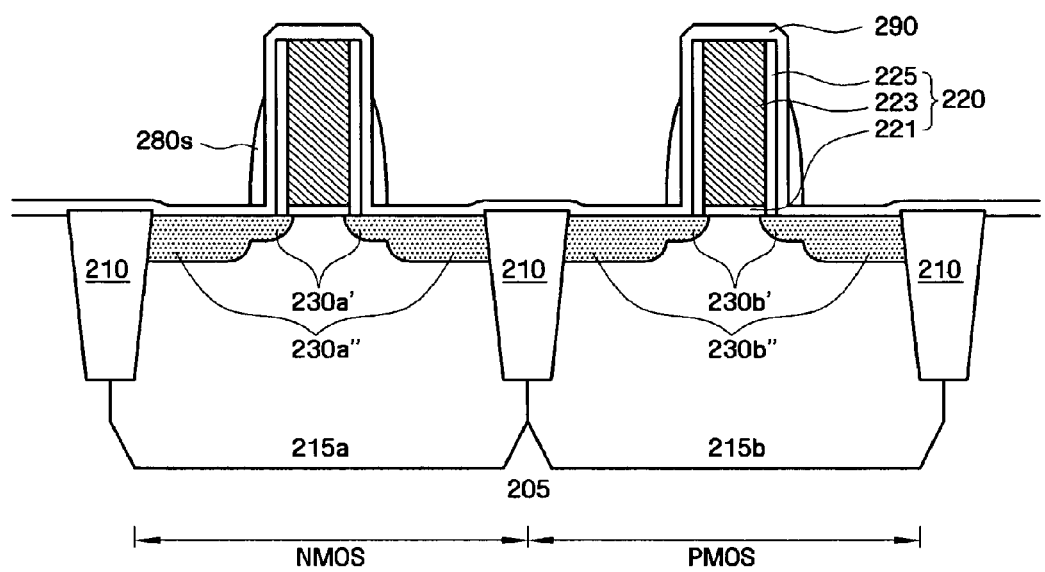
FIGS. 4A through 4C illustrate schematic longitudinal sectional views of another method of manufacturing a semiconductor device according to example embodiments.

Referring to FIG. 4A, together with FIG. 3B, buffer spacers 280s may be formed while substantially maintaining the original shape of the first etch-stop layer 290, and high-concentration source/drain regions 230a" and 230b" may be formed. As described above with reference to FIG. 3C, after forming the buffer spacers 280s, the high-concentration source/drain regions 230a" and 230b" may be formed using, as an ion-implantation buffer layer, the first etch-stop layer 290 on surfaces of the low-concentration source/drain regions 230a' and 230b'. Alternatively, the high-concentration source/drain regions 230a" and 230b" may be formed at a later time.

Figure 4B:
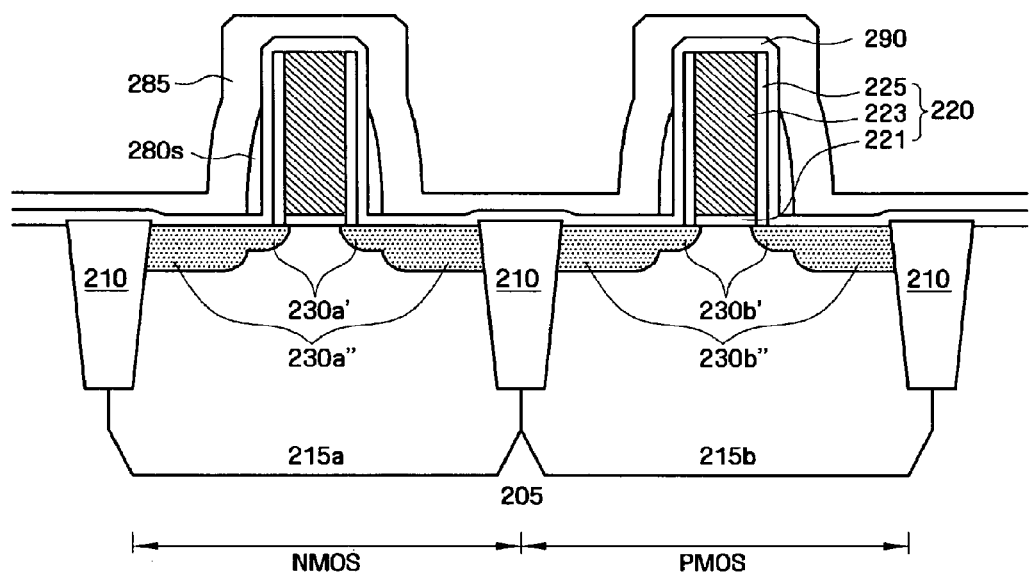

Referring to FIG. 4B, a mask spacer layer 285 may be formed on the structure of FIG. 4A. Consequently, as in FIG. 3D, the mask spacer layer 285 may not be in contact with surfaces of the low-concentration source/drain regions 230a' and 230b'.

Figure 4C:
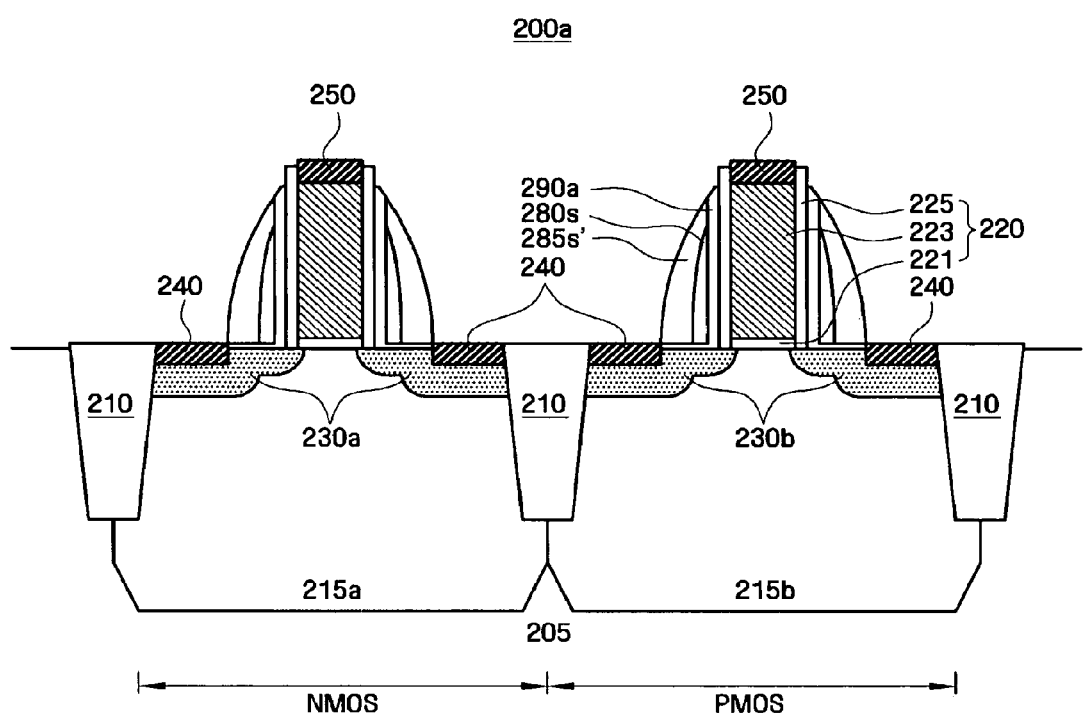

Referring to FIG. 4C, mask spacers 285s' and first etch-stop layer patterns 290a as well as the source/drain silicide regions 240 and the gate silicide regions 250 may be formed. If high-concentration source/drain regions 230a" and 230b" have not been formed in the previous process, when forming the mask spacers 285s, a residue of the first etch-stop layer 290 may be allowed to remain on surfaces of the low-concentration source/drain regions 230a' and 230b' as an ion-implantation buffer layer for forming the high-concentration source/drain regions 230a" and 230b". The residue of the first etch-stop layer 290 on surfaces of the low-concentration source/drain regions 230a' and 230b' may be removed, and the source/drain silicide regions 240 and the gate silicide regions 250 may be formed. The formation of the source/drain silicide regions 240 and the gate silicide regions 250 may be as described above. Although not shown, the mask spacers 285s', the buffer spacers 280s, and the first etch-stop layer patterns 290a may be removed, and the process illustrated in FIG. 3H as well as subsequent processes may be performed.

Figure 5A:
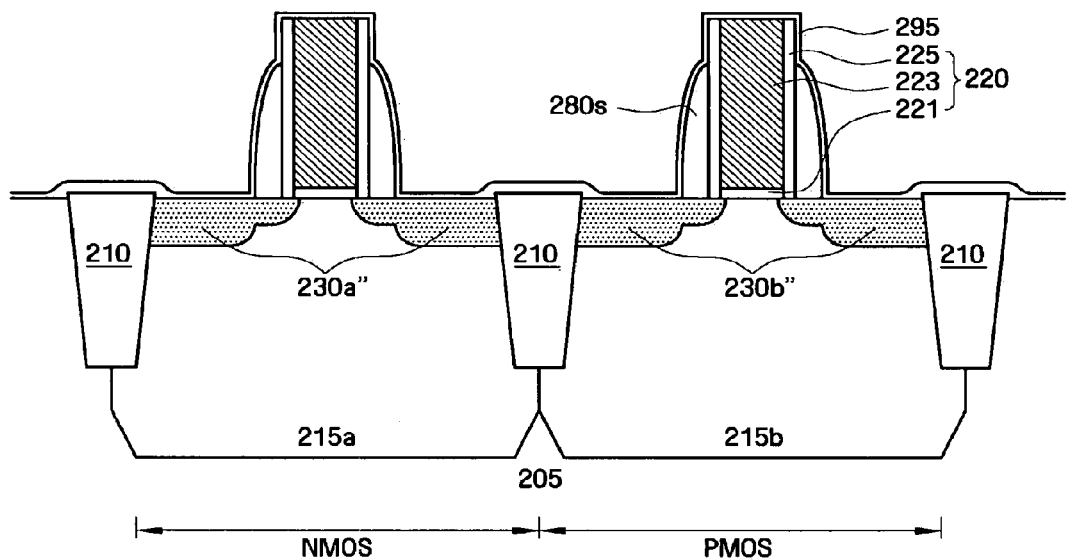
FIGS. 5A through 5C illustrate schematic longitudinal sectional views of another method of manufacturing a semiconductor device according to example embodiments.
Figure 5B:
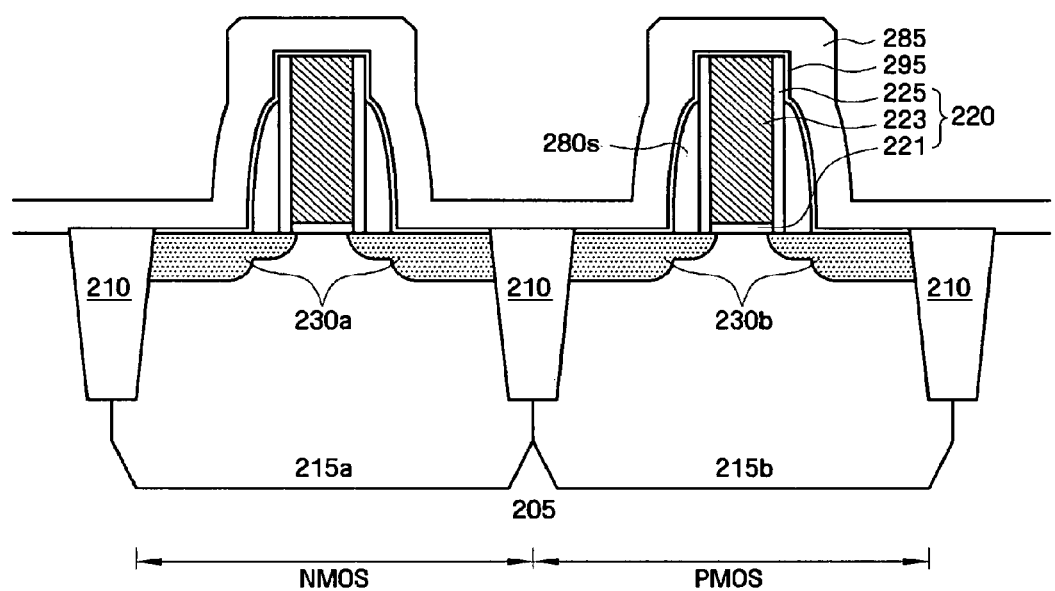
Figure 5C:
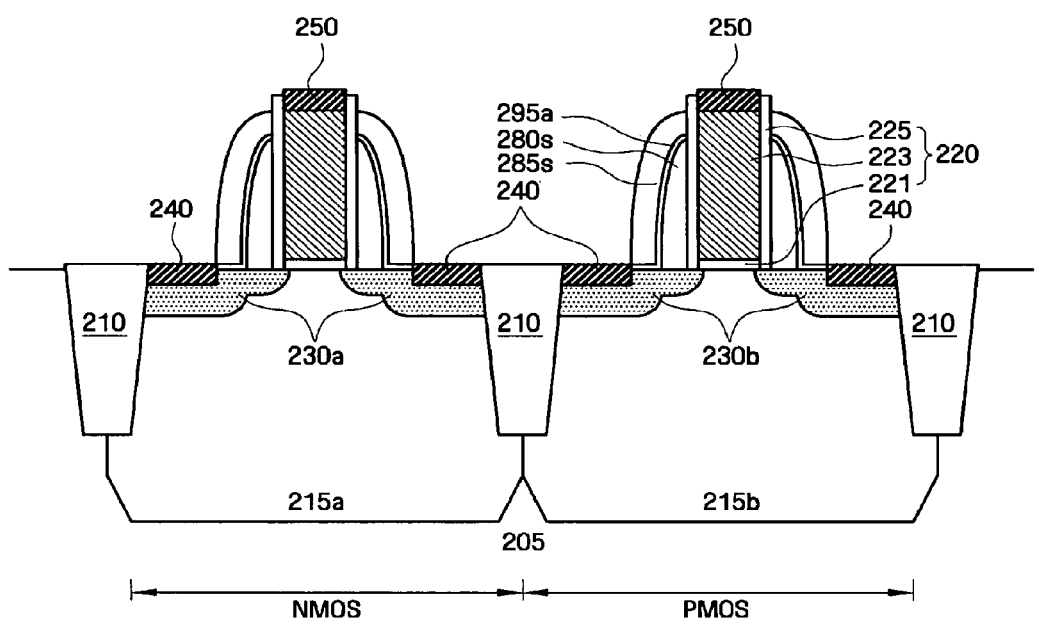

FIGS. 5A through 5C are schematic longitudinal sectional views illustrating another method of manufacturing the semiconductor device according to example embodiments. Referring to FIG. 5A, buffer spacers 280s and a second etch-stop layer 295 may be formed in the absence of a first etch-stop layer. For example, a buffer spacer layer (see 280 in FIG. 3B) may be formed in the absence of a first etch-stop layer (see 290 in FIG. 3B) and patterned so as to form the buffer spacers 280s. The buffer spacer layer may have a higher etch rate and, thus, may be patterned with reduced or no etching damage to other material layers even in the absence of a first etch-stop layer. After forming the second etch-stop layer 295, high-concentration source/drain regions 230a" and 230b" may be formed. Alternatively, the high-concentration source/drain regions 230a" and 230b" may be formed in a subsequent process.

Referring to FIG. 5B, a mask spacer layer 285 may be formed on the structure of FIG. 5A. The formation of the mask spacer layer 285 may be as described above with reference to FIG. 4B. Referring to FIG. 5C, mask spacers 285s as well as source/drain silicide regions 240 and gate silicide regions 250 may be formed. The formation of the mask spacers 285s and the source/drain silicide regions 240 and the gate silicide regions 250 may be as described above with reference to FIGS. 3F and 4C. The high-concentration source/drain regions 230a" and 230b" may alternatively be formed prior to forming the source/drain silicide regions 240 and the gate silicide regions 250. For example, when forming the mask spacers 285s, the high-concentration source/drain regions 230a" and 230b" may be formed while maintaining the original shape of the second etch-stop layer 295. When forming the source/drain silicide regions 240 and the gate silicide regions 250, a portion of the second etch-stop layer 295 on the source/drain regions 230a and 230b may be removed such that the resulting second etch-stop layer patterns 295a may be formed only along inner surfaces of the mask spacers 285s. Although not shown, the mask spacers 285s, the second etch-stop layer patterns 295a, and the buffer spacers 280s may be removed to achieve the structure illustrated in FIG. 3G.

Semiconductor devices manufactured by methods according to example embodiments may have different shapes. For example, the positions and shapes of high-concentration source/drain regions and silicide regions may vary according to the thicknesses of an etch-stop layer, a buffer spacer layer, and/or a mask spacer layer. The positions, widths, shapes, etc. of high-concentration source/drain regions may also vary according to when the high-concentration source/drain regions are formed.

Figure 6:
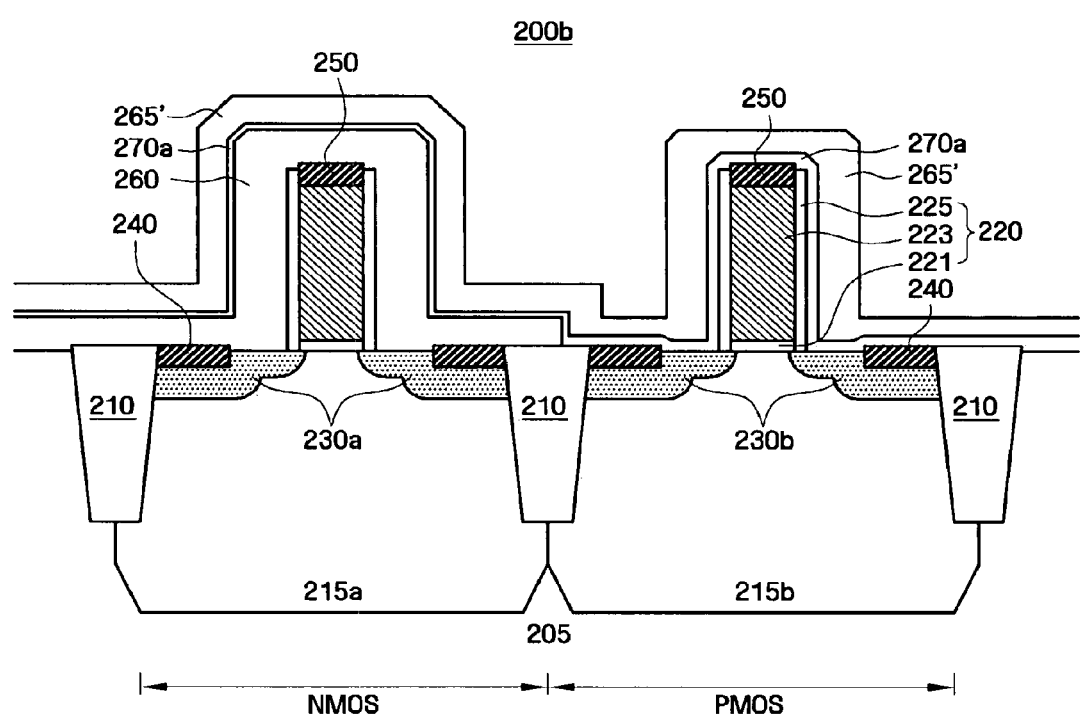
FIG. 6 illustrates a schematic longitudinal sectional view of a method of forming stress layers of a semiconductor device according to example embodiments.

FIG. 6 illustrates a schematic longitudinal sectional view of a method of forming stress layers of a semiconductor device according to example embodiments. Referring to FIG. 6, a compressive buffer layer 270a and a compressive stress layer 265' may be sequentially formed on the structure of FIG. 3H. The compressive buffer layer 270a may be formed of silicon oxide. Portions of the compressive stress layer 265' and the compressive buffer layer 270a on the NMOS area may be removed using a photolithography process to thereby achieve the semiconductor device 200b as illustrated in FIG. 2B.

Figure 7A:
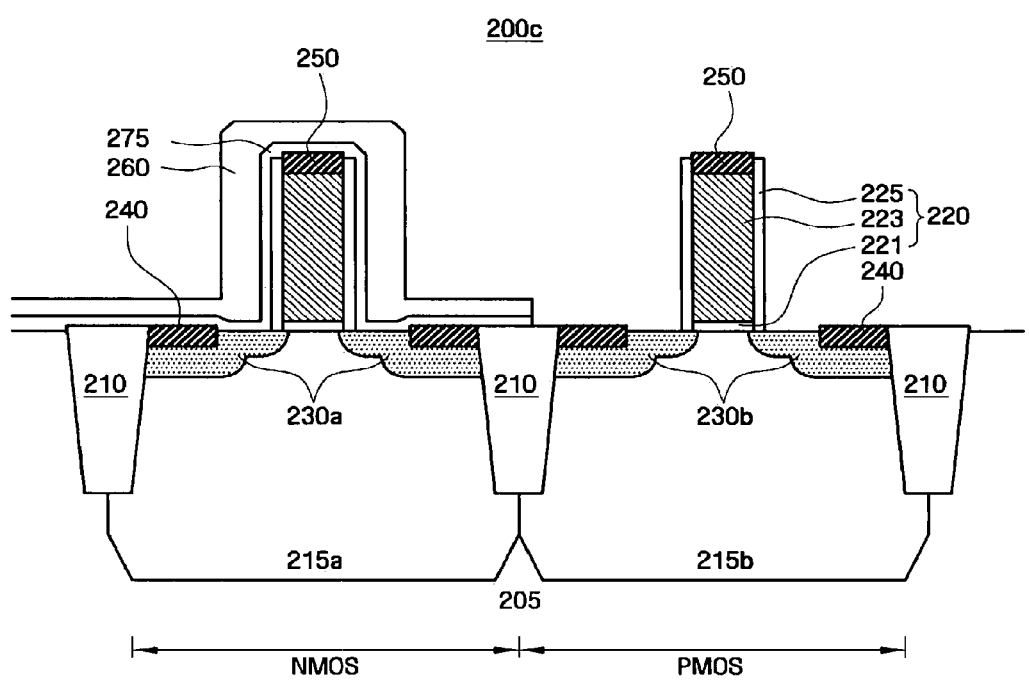
FIGS. 7A and 7B illustrate schematic longitudinal sectional views of another method of forming stress layers of a semiconductor device according to example embodiments.
Figure 7B:
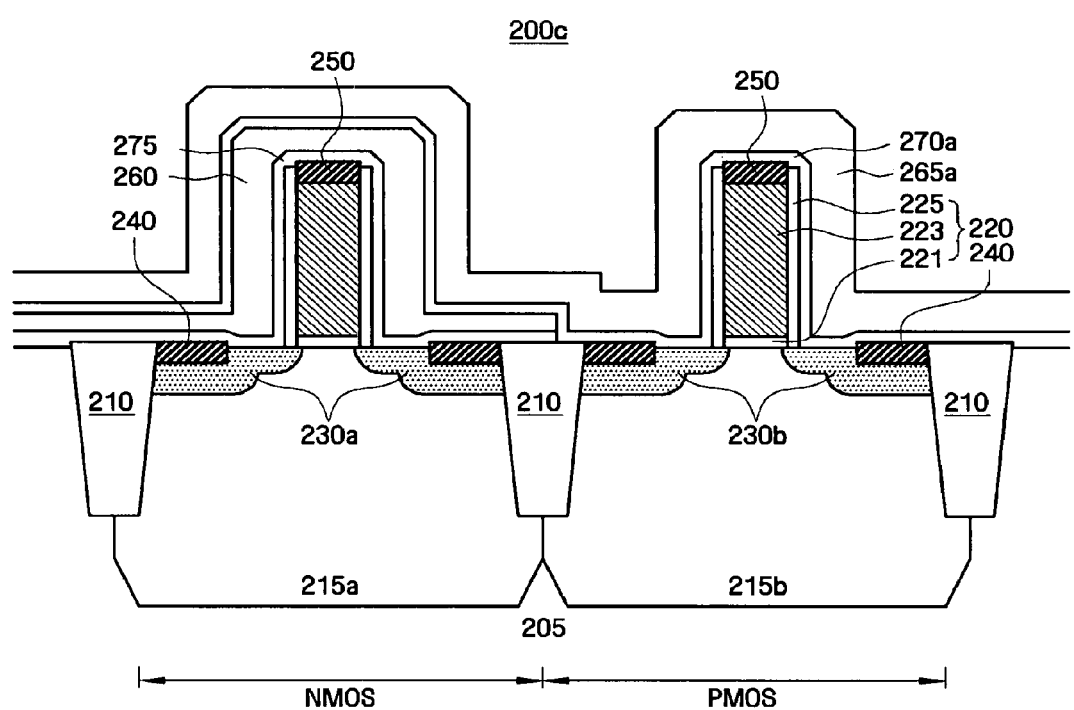

FIGS. 7A and 7B illustrate schematic longitudinal sectional views illustrating another method of forming stress layers of a semiconductor device according to example embodiments. Referring to FIG. 7A, together with FIG. 3G, a tensile buffer layer 275 and a tensile stress layer 260 may be formed on the structure of FIG. 3G. Portions of the tensile stress layer 260 and the tensile buffer layer 275 in a PMOS area may be removed using a photolithography process such that the tensile buffer layer 275 and the tensile stress layer 260 only remain on an NMOS area. The tensile buffer layer 275 may be used as an etch-stop layer when the tensile stress layer 260 is patterned. When patterning the tensile stress layer 260, it may be beneficial for the tensile buffer layer 275 to be thinner so as to reduce or prevent etching damage to the surface of the substrate 205 and/or the source/drain regions 230a and 230b. After patterning the tensile stress layer 260, an exposed portion of the tensile buffer layer 275 on the PMOS area may be removed, although the exposed portion of the tensile buffer layer 275 may have already been partially removed during the patterning of the tensile stress layer 260. The exposed portion of the tensile buffer layer 275 on the PMOS area may be removed with a wet etching process or a cleaning process. For example, the tensile buffer layer 275 may be formed of silicon oxide and, thus, may be removed using a diluted HF solution. Various wet etching processes may be utilized depending on the material of construction for the tensile buffer layer 275. Alternatively, the tensile buffer layer 275 may be allowed to remain on the PMOS area.

Referring to FIG. 7B, a compressive buffer layer 270a and a compressive stress layer 265a may be sequentially formed on the structure of FIG. 7A. The compressive buffer layer 270a may be formed of silicon oxide (e.g., LTO), and the compressive stress layer 265a may be formed of silicon nitride. Portions of the compressive stress layer 265a and the compressive buffer layer 270a on an NMOS area may be removed using a photolithography process such that the compressive buffer layer 270 and the compressive stress layer 265 only remain on a PMOS area to thereby achieve the semiconductor device 200c as illustrated in FIG. 2C. For example, the portion of the compressive buffer layer 270a in the NMOS area may be used as an etch-stop layer when the compressive stress layer 265a is patterned. After forming the compressive stress layer 265 on the PMOS area, the exposed portion of the compressive buffer layer 270a may be removed so as to achieve a compressive buffer layer 270 below the compressive stress layer 265 on the PMOS area.

Figure 8A:
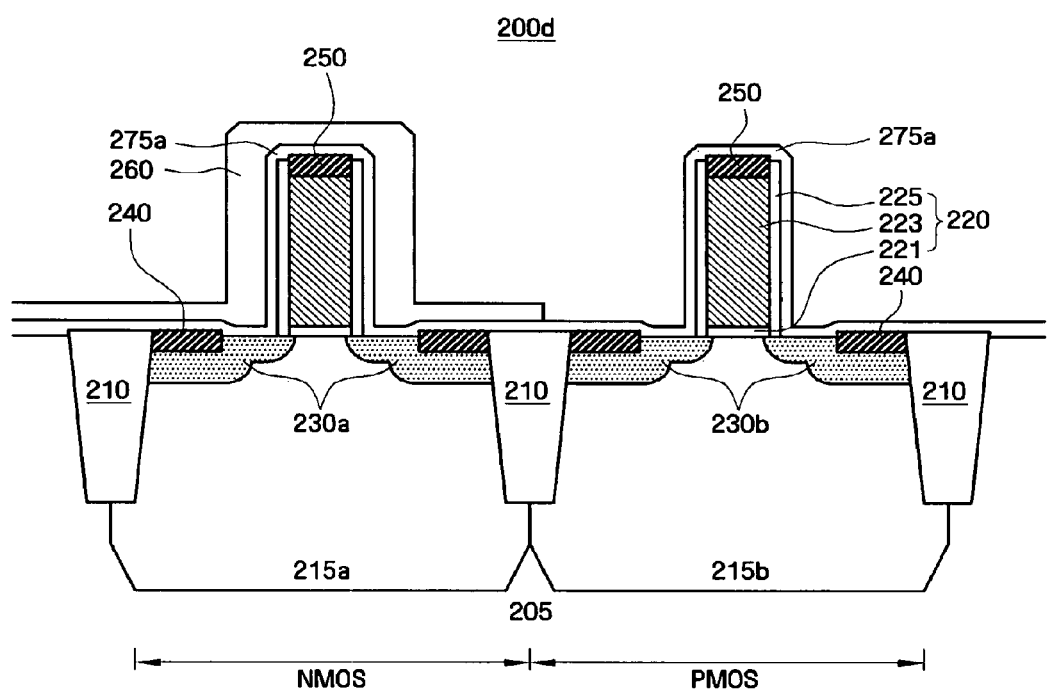
FIGS. 8A and 8B illustrate schematic longitudinal sectional views of another method of forming stress layers of a semiconductor device according to example embodiments.
Figure 8B:
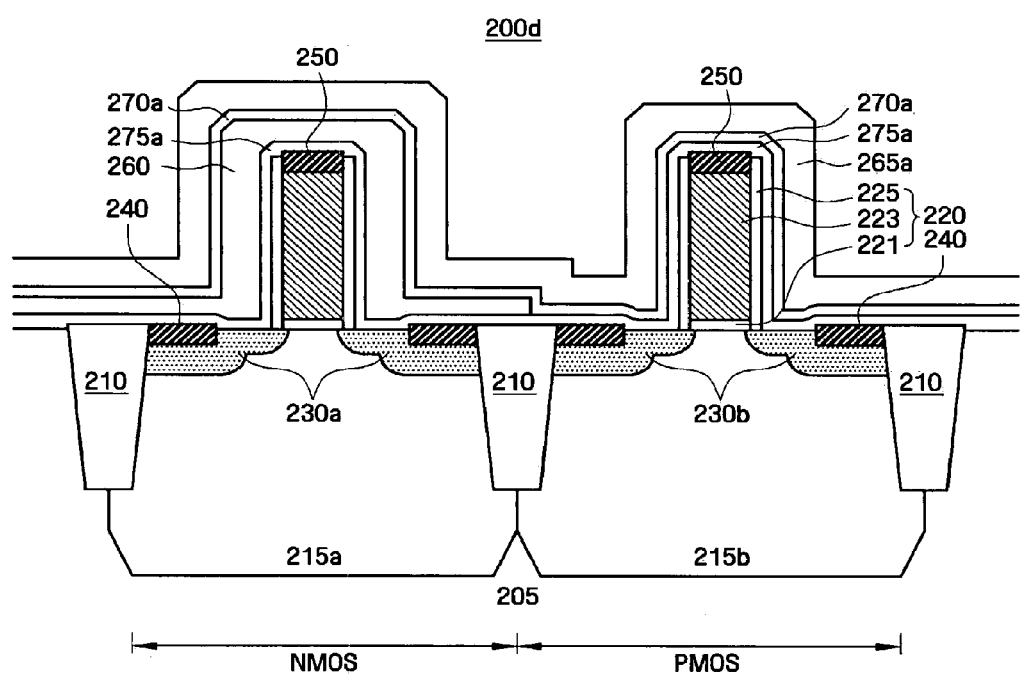

FIGS. 8A and 8B illustrate schematic longitudinal sectional views of another method of forming stress layers of a semiconductor device according to example embodiments. Referring to FIG. 8A, together with FIG. 3G, a tensile buffer layer 275a and a tensile stress layer 260 may be formed on the structure of FIG. 3G. A portion of the tensile stress layer 260 on a PMOS area may be removed using a photolithography process such that the tensile buffer layer 275a may be formed in both the NMOS area and the PMOS area, while the tensile stress layer 260 may be formed only in the NMOS area. The tensile buffer layer 275a may be used as an etch-stop layer when the tensile stress layer 260 is patterned.

Referring to FIG. 8B, a compressive buffer layer 270a and a compressive stress layer 265a may be formed on the tensile stress layer 260 of the NMOS area and the tensile buffer layer 275a of the PMOS area. As illustrated in FIG. 8B, the buffer layer (e.g., buffer layers 270a and 275a) in the PMOS area may be thicker than the buffer layer (e.g., buffer layer 275a) in the NMOS area. Although not shown, the portions of the compressive stress layer 265a and the compressive buffer layer 270a on the NMOS area may be removed to thereby achieve the semiconductor device 200d as illustrated in FIG. 2D.

As described above, in semiconductor devices and methods of manufacturing the same according to example embodiments, the stress effect achieved with stress layers may be increased while reducing or preventing damage to the active regions, thereby increasing the operational stability and reliability of the semiconductor devices.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:

1. A method of manufacturing a semiconductor device, the method comprising:

forming an NMOS transistor structure and a PMOS transistor structure with an isolation layer therebetween, the isolation layer disposed in a semiconductor substrate, each transistor structure including source/drain regions in the semiconductor substrate and a gate electrode;

forming a tensile stress layer on the NMOS transistor structure;

forming a compressive stress layer on the PMOS transistor structure; and providing a buffer layer under the compressive stress layer after forming the tensile stress layer, the buffer layer confined to an undersurface of the compressive stress layer, wherein a portion of the compressive stress layer overlaps a portion of the tensile stress layer above the isolation layer, the tensile stress layer directly contacting the isolation layer, and a bottom surface of the tensile stress layer on the isolation layer and a bottom surface of the compressive stress layer on the isolation layer are located at different vertical levels.

2. The method of claim 1, wherein the tensile stress layer directly contacts a silicide layer that is disposed on the gate electrode of the NMOS transistor structure.

3. The method of claim 1, wherein the tensile stress layer directly contacts a silicide layer of each of the source/drain regions.

4. The method of claim 1, wherein the compressive stress layer overlaps the buffer layer on the NMOS transistor structure and the tensile stress layer on the NMOS transistor structure.

5. The method of claim 1, wherein the buffer layer directly contacts the isolation layer.

6. The method of claim 1,
wherein the buffer layer overlaps the tensile stress layer on the NMOS transistor structure and the compressive stress layer on the NMOS transistor structure.

7. A method of manufacturing a semiconductor device, comprising:
forming an NMOS transistor structure and a PMOS transistor structure with an isolation layer therebetween, each transistor structure including a gate electrode and source/drain regions;
forming a silicide layer on at least one of the source/drain regions of the NMOS transistor structure, the silicide layer contacting a top portion of the isolation layer;
forming a tensile stress layer on the NMOS transistor structure;
forming a compressive stress layer on the PMOS transistor structure; and
providing a buffer layer under the compressive stress layer after forming the tensile stress layer, the buffer layer confined to an undersurface of the compressive stress layer,
wherein a portion of the compressive stress layer overlaps a portion of the tensile stress layer above the isolation layer, the tensile stress layer directly contacts the isolation layer, and a bottom surface of the tensile stress layer on the isolation layer and a bottom surface of the compressive stress layer on the isolation layer are located at different vertical levels.

8. The method of claim 7, further comprising:
forming the silicide layer on at least one of the source/drain regions of the PMOS transistor structure.

9. The method of claim 7, wherein the compressive stress layer overlaps the buffer layer on the NMOS transistor structure and the tensile stress layer on the NMOS transistor structure.

10. The method of claim 7, wherein the buffer layer directly contacts the isolation layer.

* * * * *